(12) United States Patent
Abassi et al.

(10) Patent No.: US 6,445,329 B1
(45) Date of Patent: Sep. 3, 2002

(54) HIGH SPEED ANALOG TO DIGITAL CONVERTER

(75) Inventors: Saeed Abassi, Wynnewood, PA (US); Fangxing Wei, Chandler, AZ (US); Michael Roden, Flagtown, NJ (US)

(73) Assignee: ATI International SRL, Barbados (BB)

( * ) Notice: Subject to any disclaimer, the term of this patent is extended or adjusted under 35 U.S.C. 154(b) by 0 days.

(21) Appl. No.: 09/690,396

(22) Filed: Oct. 17, 2000

(51) Int. Cl.[7] .............................................. H03M 1/12
(52) U.S. Cl. ..................... 341/156; 331/17; 341/118; 341/120; 341/122; 341/155; 341/156
(58) Field of Search ................................ 341/155, 156, 341/122, 120, 118

(56) References Cited

U.S. PATENT DOCUMENTS 6,011,502 A * 1/2000 Kao ........................... 341/156
6,069,579 A * 5/2000 Ito et al. ..................... 341/156
6,107,949 A * 8/2000 Gross, Jr. .................... 341/159
6,292,061 B1 * 9/2001 Qu .............................. 331/17

* cited by examiner

Primary Examiner—Michael Tokar
Assistant Examiner—Linh Van Nguyen
(74) Attorney, Agent, or Firm—Volpe and Koenig, PC

(57) ABSTRACT

An analog to digital converter having a group of subrange analysis blocks and reference voltage and offset voltage selection blocks. Each subrange analyses block produces an output representative of a range of bits in a digital output of the analog digital converter. The reference voltage and offset voltage selection blocks enable the operating conditions for the next subrange analysis block to be optimized for both linearity and operating speed.

24 Claims, 4 Drawing Sheets

HIGH SPEED ANALOG TO DIGITAL CONVERTER

BACKGROUND

The invention generally relates to electrical circuit components. In particular, the invention relates to analog to digital converters.

Analog to digital converters (ADC) take analog electrical signals and convert them into a digital format. The ADC will sample the analog signal at a clocking rate and convert each sample into a digital output. The value of the digital output is based on the magnitude of the sample's voltage. Due to the increasing speeds of electrical circuitry, it is desirable to have faster ADCs.

One approach to making high speed ADCs uses bipolar technology. One drawback to bipolar technology is that it has higher power dissipation than complementary metal oxide semiconductor (CMOS) field effect transistor technology. Additionally, the signal to noise distortion ratio (SNDR) is not satisfactory for some applications. For example, a typical bipolar ADC using a five volt power supply, 50 megahertz (MHz) input frequency and ten bit resolution would dissipate four watts and would have a SNDR of 47 decibels (dB).

CMOS based ADCs typically have not had the resolution, such as only six to eight bits of resolution, compared to 10 bits or more of bipolar ADCs. The CMOS ADCs also use high power supply voltages, such as 3.3 volts to 10 volts. Such high power supply voltages are not compatible with some semiconductor technologies, such as 0.18 micrometer (um), or lower technology.

Some design approaches to improve CMOS ADCs have used single step parallel flash converters, which have resulted in larger chip areas and high power dissipation for these ADCs. Additionally, these CMOS ADCs have not had satisfactory SNDRs, which reduces the accuracy achieved by the higher resolution.

Accordingly, it is desirable to have alternate approaches to producing high speed ADCs.

SUMMARY

An analog to digital converter having several groups of range analysis blocks. Each range analysis block produces an output representative of a range of bits in a digital output of the analog to digital converter. The first range analysis block analyzes the analog signal in a coarse manner, and selects the appropriate reference voltage and offset voltage to pass to the next set of range analysis blocks, the next set of blocks analyzes the analog signal at a higher precision.

DESCRIPTION OF THE PREFERRED EMBODIMENT(S)

Figure 1:
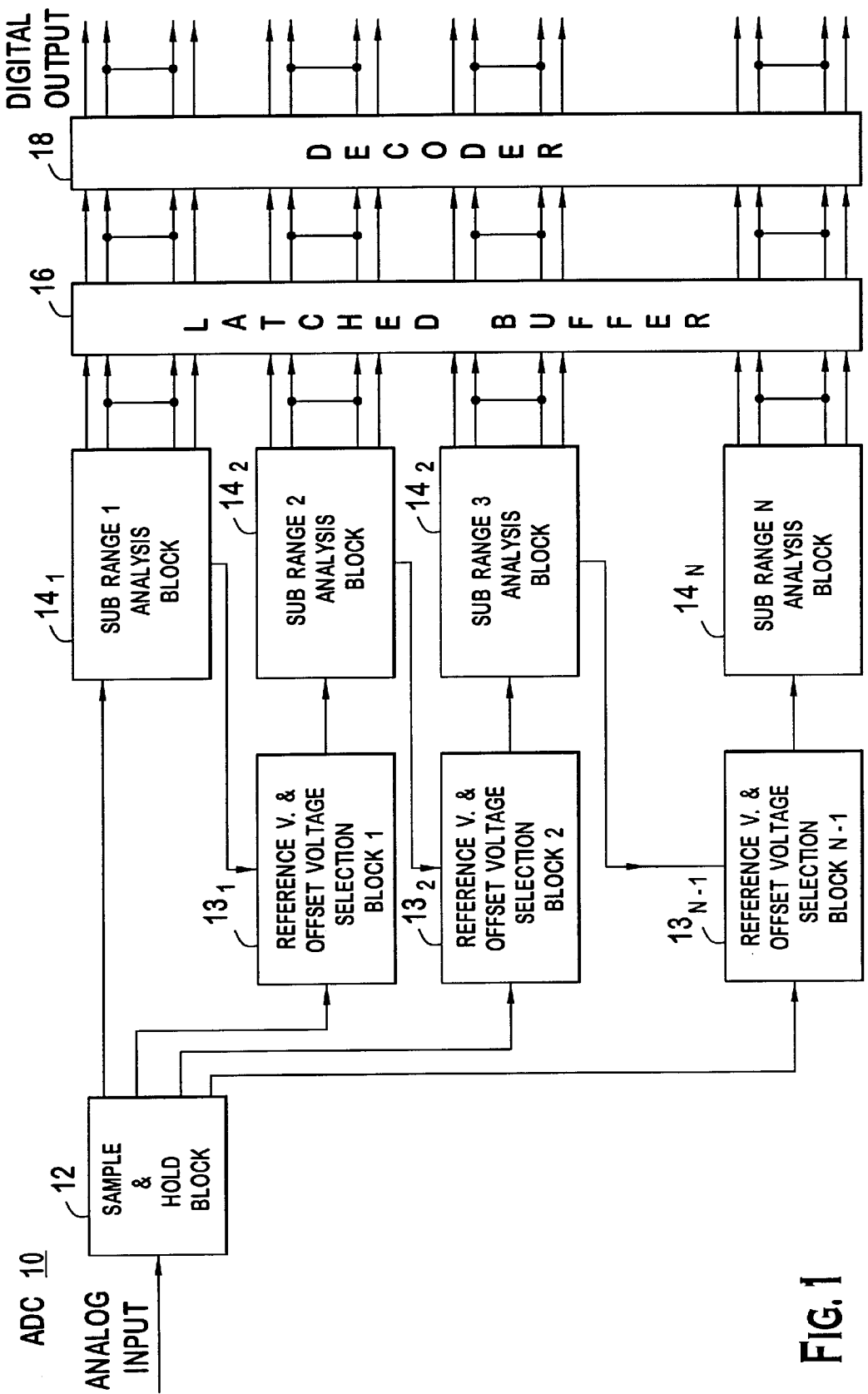
FIG. 1 is an analog to digital converter.

FIG. 1 illustrates a high speed analog to digital converter (ADC) 10. A sample and hold block 12 samples an analog signal, such as once every clock period. The samples are held for use by groups of reference voltage and offset voltage selection blocks $13_1$ to $13_{N-1}$ and subrange analysis blocks $14_1$ to $14_N$. Each subrange analysis block $14_1$ to $14_N$ is used to produce a certain range of bits in the digital output for each sample. For instance, if two subrange blocks $14_1$, $14_2$ and one reference voltage and offset voltage selection block $13_1$ were used, $14_1$ would be used to produce the most significant bits of the digital output and the one selection block $13_1$ with the second subrange block $14_2$ would be used to produce the least significant bits of the digital output. One such ADC uses a 5 bit most significant bit subblock $14_1$, a five bit reference voltage and offset voltage selection block $13_1$ and a 6 bit least significant bit subblock $14_2$ to result in a 10 bit ADC with the extra bit used for error correction.

An output from each subrange analysis block $14_1$ to $14_{N-1}$ is input to the corresponding reference voltage and offset voltage selection block $13_1$ to $13_{N-1}$ and is used to select a reduced range of reference voltages and an appropriate offset voltage for the next subrange analysis block $14_2$ to $14_N$. The analog signal sample is subtracted from the closest higher reference voltage and the offset voltage is added to both the high and low reduced range reference voltages such as to optimally position the reduced range for the next subrange analysis block with regard to linearity and noise sensitivity. As a result, the analysis of the analog signal cascades through the subrange blocks $14_1$ to $14_N$ from the most significant bit to the least significant bit.

The multiple subrange block structure allows for only the least significant blocks to require high accuracy and the most significant blocks to have a reduced accuracy, which reduces the ADC's cost and complexity. Additionally, since each block $14_1$ to $14_{N-1}$ enables the selection of a reduced range reference voltage and an offset voltage for the next subrange analysis block, the slew rate for each block is reduced, allowing for higher signal to noise distortion ratios (SNDRs), lower supply voltages, lower power dissipation and smaller die areas. The block structure also allows for the ADC 10 to be produced on an integrated circuit chip using deep submicron CMOS technology.

The subrange block structure also allows for pipelining of data. One clock period is typically required for sampling the analog signal. For one pipelining approach, each subrange block and it's associated reference voltage and offset voltage selection block performs its analysis and voltage selection in one clock period. For example, sample one is input into a subrange block $14_1$. The subrange block $14_1$ analyzes sample one and outputs its result and activates the selection of the appropriate reference voltage range and offset voltage in selection block $13_1$, in one clock period. In the next clock period, the subrange block $14_1$ analyzes sample two, and subrange block $14_2$ analyses sample one. Thus, to analyze one sample using this pipelining approach requires N+1 clock periods, where N is the number of subrange blocks $14_1$ to $14_N$.

Figure 2:
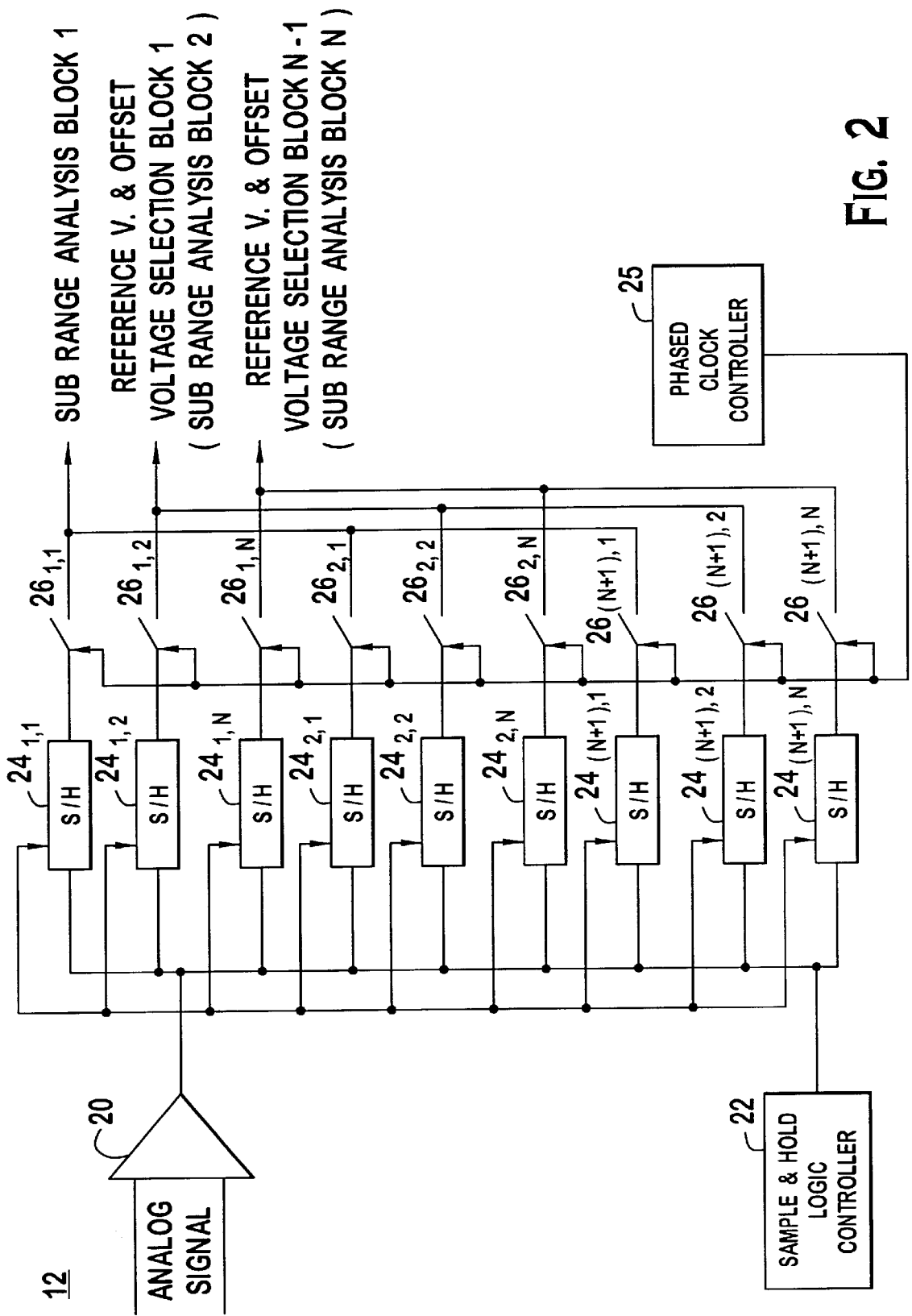
FIG. 2 is a sample and hold device for pipelining.

FIG. 2 is a sample and hold block 12 that is compatible with pipelining techniques. The analog signal is input to an operational amplifier (op amp) 20. The output of the op amp 20 is input into a group of sample and hold devices $24_{1,1}$ to $24_{(N+1),N}$. One sample and hold device is required to store a sample for each subrange analysis block $14_1$ to $14_N$. Since each sample takes N+1 clock cycles for analysis, for optimum pipelining, N+1 groups of sample and hold devices are required, totaling (N+1)N sample and hold devices $24_{1,1}$ to $24_{(N+1),N}$. After a sample and hold device group has held its sample for N+1 clock periods, the group can be used for another sample. Since each sample and hold device is associated with a subrange analysis block, a phased clock controller 25 selectively switches, using the switches $26_{1,1}$ to $26_{(N+1),N}$, the sample and hold devices $24_1$, to $24_{(N+1),N}$, to their corresponding subrange blocks $14_1$ to $14_N$, via the appropriate reference voltage and offset voltage selection blocks. This facilitates the pipelining through the subrange blocks $14_1$ to $14_N$. The sample and hold logic controller 22 enables groups of the sample and hold devices, when they are required to sample the analog signal. Otherwise, the controller 22 keeps the sample and hold devices in the hold mode.

To illustrate a system using two subrange blocks $14_1$, $14_2$, six (3×2) sample and hold devices are used. In the first clock cycle, a sample is taken and stored in the first two sample and hold devices. In the second clock cycle, the first sample is analyzed by the most significant subrange block and a second sample is placed into the next two sample and hold devices. In the third clock cycle, the first sample is analyzed by the least significant subrange block, the second sample is analyzed by the most significant subrange block, and a third sample is stored in the last two sample and hold devices. In a fourth clock period, a fourth sample is taken and stored in the first two sample and hold devices and the whole process is repeated.

The outputs of each subrange block $14_1$ to $14_N$ correspond to each possible digital output associated with that block $14_1$ to $14_N$. For example, if the subrange block is responsible for 5 digital bits of the digital output, the subrange block outputs 32, that is $2^5$, signals.

To facilitate pipelining, a latched buffer 16 as shown in FIG. 1 may be used. The latched buffer 16 holds the results from each subrange analysis block $14_1$ to $14_N$. The buffered latched outputs allow the results for a given sample to be received by the decoder 18 simultaneously.

The decoder 18 receives the outputs from each subrange analysis block $14_1$ to $14_N$ and produces the digital output. Since each subrange block $14_1$ to $14_N$ produces a range of bits in the digital output, the decoding can also be performed prior to the latched buffering. Each subrange analysis block $14_1$ to $14_N$ has an associated decoder. A latched buffer 16 stores the output from a subrange analysis block decoder, until all of the analog data samples have been processed by the subrange analysis blocks. A decoder then decodes the stored outputs into the appropriate code format. As a result, the bits for a particular sample can be taken from that decoder as the digital output.

Figure 3:
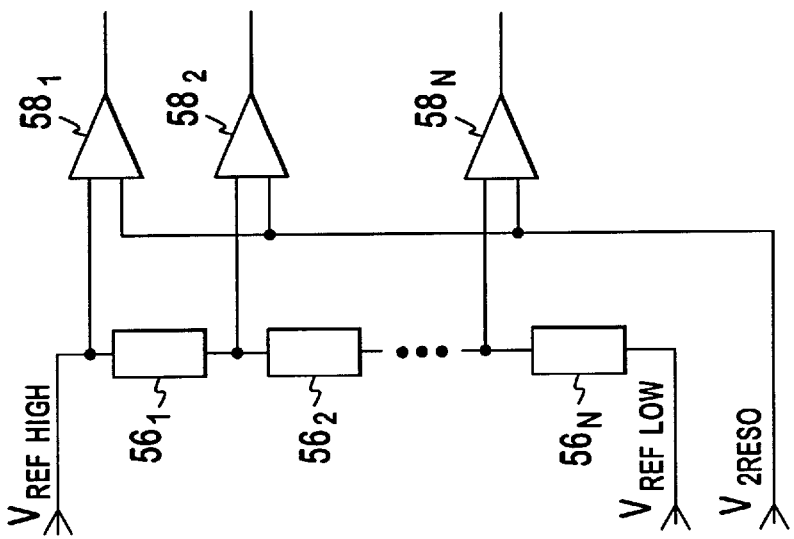
FIG. 3 is a range analysis block.

One subrange analysis block circuit 28, such as the most significant bits subrange analysis block, is shown in FIG. 3. The subrange analysis block 28 is also referred to as a N bit flash. The subrange analysis block 28 compares the sampled voltage of the analog signal to a set of reference voltages to determine the value of the sample. The number of reference voltages required is based on the desired resolution of the block 28. For instance, if five bit resolution is desired, 32 reference voltages must be used. As shown in FIG. 3, one approach to produce the reference voltages is to divide a full scale voltage ($V_{REF\ HIGH}-V_{REF\ LOW}$) by a number of equal value resistors $30_1$ to $30_N$ to produce the reference voltages. For 32 reference voltages, 32 equal resistors are used. For each reference voltage, a comparator $32_1$ to $32_N$ compares the sample voltage, $V_{SAMPLE}$, to the reference voltage. The odd numbered comparators $32_1$ to $32_N$ where the reference voltage is less than or equal to the sample voltage produce a positive comparison signal. The even numbered comparators produce a negative comparison signal. The decoder 18, as shown in FIG. 1, will take these comparator outputs and produce the appropriate output for the corresponding range of bits of the digital output.

For each non-most significant subrange block $14_2$ to $14_N$, a derivation of the preceding block's analysis is used for its analysis. In one approach, the reference voltage and offset voltage selection block passes a voltage, $V_{MUX}$, which has the value of the closest reference voltage above the sampled voltage, see FIG. 4. To illustrate, if in FIG. 3, $V_{REF\ HIGH}-V_{REF\ LOW}=1.000$ Volts, and there are thirty two equal resistors $30_1$ to $30_{32}$ connecting them, then the voltage across each resistor will be 31.25 milliVolts (mV). If the preceding block determines the analog sample is between 781.25 and 812.5 mV, then 812.5 mV is passed as $V_{MUX}$.

One approach to determining a non-most significant block's range of bits in the digital output is to effectively subtract the sample voltage from $V_{MUX}$ in blocks $13_1$ to $13_{N-1}$. The subtracted sample voltage has a value less than the lowest resolution of the previous subrange analysis block. For example, if the previous subrange block distinguished between 0.1 volt increments, the maximum value of the subtracted sample would be 0.1 volts. The subtracted sample is subsequently compared to a set of reference voltages to produce the next bits in the digital output.

Figure 4:
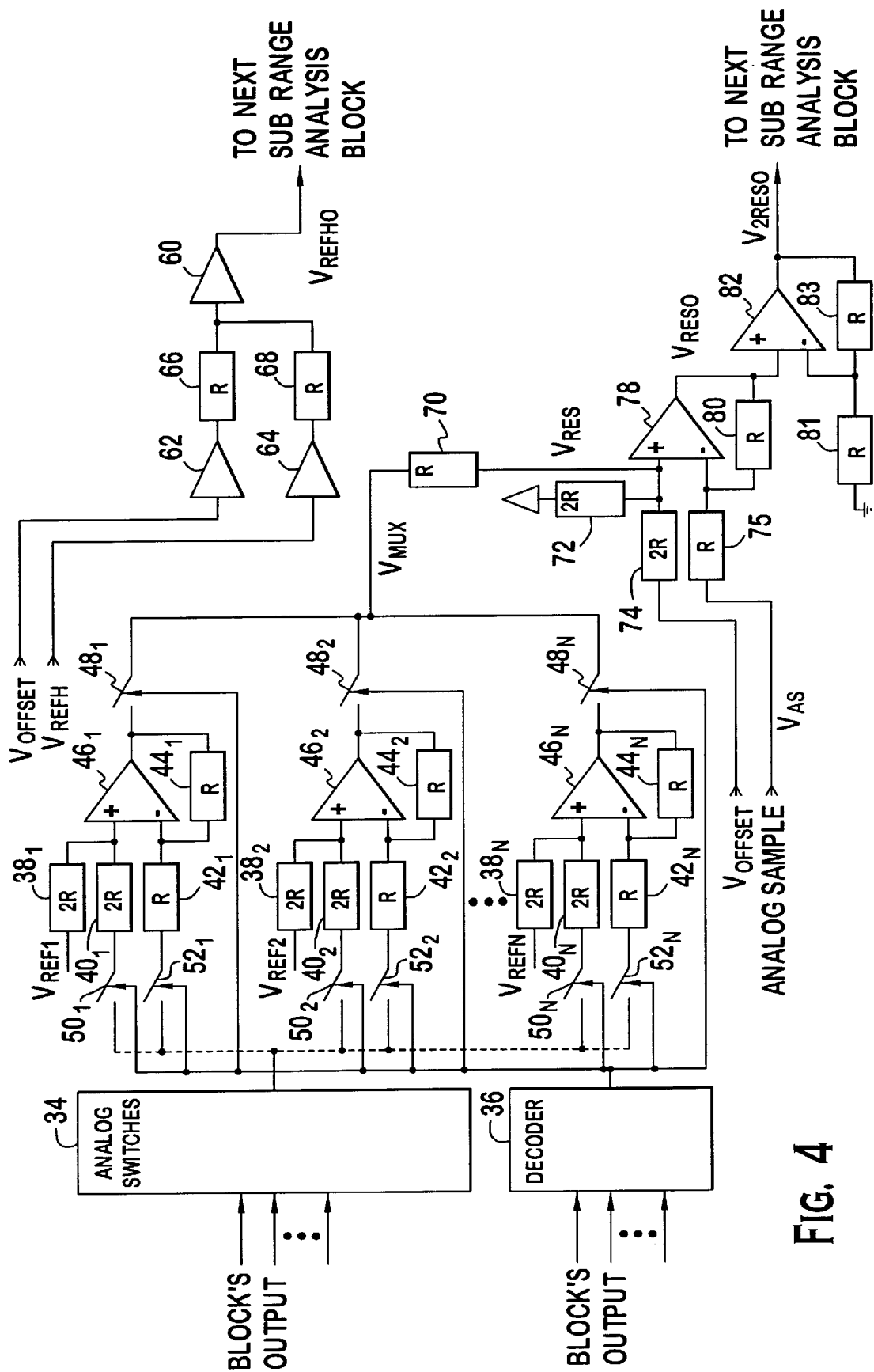

One circuit for generating $V_{MUX}$ is shown in FIG. 4. Each op amp $46_1$ to $46_N$, associated resistors $38_1$ to $44_N$ and reference voltages, $V_{REF1}$ to $V_{REFN}$, are configured to output a set of reference voltages, such that the maximum swing is only 125 mV. A reference voltage, $V_{REF1}$ to $V_{REFN}$, in the midpoint of the range for each amplifier $46_1$ to $46_N$ is input to each amplifiers top resistor $38_1$ to $38_N$. The resistors are provided with values so that the 2R resistors $38_1$ to $40_N$ have a resistance twice that of the R resistors $42_1$ to $44_N$. When the switch $50_1$ to $50_N$, which is operatively coupled to the non-inverting input, is open and the inverting switch $52_1$ to $52_N$ is closed, the op-amp output voltage is $2V_{REF}-V_-$. When the switch $50_1$ to $50_N$, which is operatively coupled to the non-inverting input, is closed and the inverting input switch $52_1$ to $52_N$ open, the op-amp output voltage is $V_{REF}+V_+$.

The decoder 36 controls which switches $50_1$ to $52_N$ are opened and closed and the analog switches 34 control the voltage level at the input to each switch $50_1$ to $52_N$. The analog switches 34 and decoder 36 receive an output from the preceding subrange analysis block, to produce $V_{MUX}$ for the next block. As a result, multiple voltage levels are capable of being produced by each op-amp $46_1$ to $46_N$ centered around that op-amp's reference voltage.

To illustrate for a system using 8 voltage levels, L1 to L8, for an op-amp's range. The range is centered around L4. 8 voltage levels, $V_{op-amp}$, can be produced by inputting the appropriate voltages to the op amp inputs as illustrated in Table 1.

non-inverting switch open, inverting switch closed $V_{op-amp}=2L4-L7=L1$ $V_{op-amp}=2L4-L6=L2$ $V_{op-amp}=2L4-L5=L3$ $V_{op-amp}=2L4-L4=L4$ non-inverting switch closed, inverting switch open $V_{op-amp}=L4+L1=L5$ $V_{op-amp}=L4+L2=L6$ $V_{op-amp}=L4+L3=L7$ $V_{op-amp}=L4+L4=L8$                    Table 1

Using this approach for generating $V_{MUX}$, the swing range of each op amp $46_1$ to $46_N$ can be maintained at a low level, such as 125 mV. A small swing allows the op amps $46_1$ to $46_N$ to operate at higher frequencies, such as frequencies in excess of 170 MHz.

Figure 5:
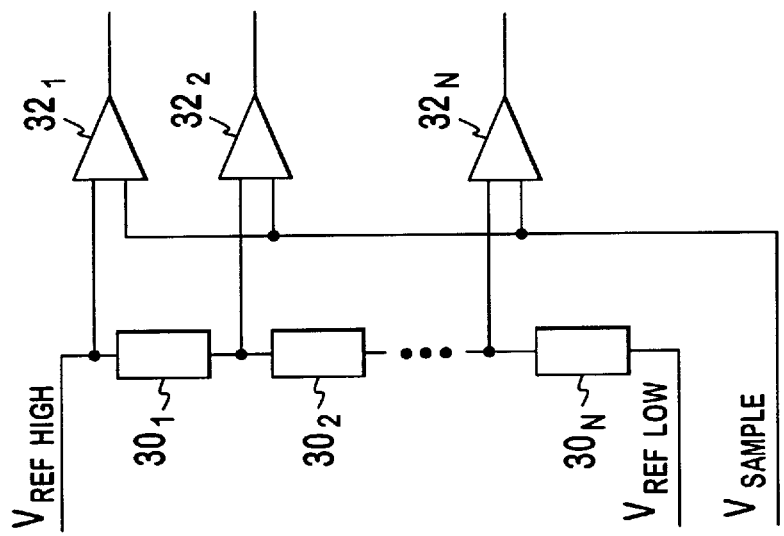
FIGS. 4 and 5 are a reference voltage and offset voltage selection block and a subrange analysis block.

To increase the accuracy and linearity of the comparators in the next subrange analysis block, $58_1$ to $58_N$ in FIG. 5, the selected reference voltage, $V_{MUX}$ is added to the offset voltage $V_{OFFSET}$. As a result, after multiplication by op-amps 78 and 82, the voltage $V_{2RESO}$ is optimally centered in the range of the next subrange analysis block. The doubling of voltage $V_{MUX}$ gives an improved SNDR.

In detail, in FIG. 4, $V_{MUX}$ is offset by a DC value, $V_{OFFSET}$, in the middle of the comparators operating range, such as 0.9 Volts. Using the produced $V_{MUX}$ the offset voltage $V_{OFFSET}$ is added, using resistors 70, 72 and 74, to give a residue voltage $V_{RES}$ equal to half of $V_{MUX}$ plus one quarter of $V_{OFFSET}$. Op-amp 78, with it's associated resistors 76 and 80, is configured to output a voltage, $V_{RESO}$, which is equal to twice the residue voltage $V_{RES}$ minus the analog sample voltage $V_{AS}$, as in Equation 1.

$$V_{RESO}=2((V_{OFFSET})/4+(V_{MUX})/2)-V_{AS}=((V_{OFFSET})/2+V_{MUX})-V_{AS} \quad \text{Equation 1}$$

To further increase the accuracy of the comparators $58_1$ to $58_N$, in FIG. 5, the value of $V_{RESO}$ is doubled prior to comparison. The configuration of op-amp 82, with resistors 81 and 83, produces an output voltage $V_{2RESO}$, equal to twice the value of voltage $V_{RESO}$, as in Equation 2.

$$V_{2RESO}=2(((V_{OFFSET})/2+V_{MUX})-V_{AS})=V_{OFFSET}+2V_{MUX}-2V_{AS}. \quad \text{Equation 2}$$

Additionally, buffer amplifiers 62, 64 and 60, with their associated resistors 66 and 68 are configured to add the offset voltage $V_{OFFSET}$ to the high reference voltage $V_{REFH}$, to produce voltage $V_{REFHO}$. The voltage $V_{REFH}$ is equal to twice the step size voltage of the previous subrange analysis block. To illustrate, if the resistor chain in the previous subrange analysis block produced reference voltages at intervals of 31.25 mV, the value of $V_{REFH}$ would equal 62.5 mV.

When the ADC 10 has more than two subrange analysis blocks $14_1$ to $14_N$ and one reference voltage and offset voltage selection block $13_1$ to $13_{N-1}$, then the second, third, fourth, . . . , (N−1)th reference voltage and offset voltage selection blocks, $13_1$ to $13_{N-1}$, together with their corresponding subrange analysis blocks $14_1$ to $14_N$, enable successively narrower reference voltage ranges to be selected. To illustrate, the subrange 3 analysis block uses the reference voltage selected by reference voltage and offset voltage selection block 2, which uses the result of the analysis by subrange 2 analysis block. In turn, the subrange 2 analysis block uses the reference voltage selected by reference voltage and offset voltage selection block 1, which uses the result of the analysis by subrange 1 analysis block.

The number of reference voltages required in each subrange analysis block is based on the desired resolution of the block $14_1$ to $14_N$. For instance, if six bit resolution is desired, 64, that is $2^6$ reference voltages are used. These reference voltages are provided by the resistor chains connected between a high reference voltage and a low reference voltage.

To illustrate for an analog to digital converter using two subrange analysis blocks $14_1$, $14_2$, the digital output of the most significant block $14_1$ selects the reference voltage that is closest above the analog sample. Subsequently, the sampled voltage is effectively subtracted from this chosen reference voltage. The result of the subtraction is the complement of the analog residue voltage. This least significant complementary analog voltage is processed and compared to reference voltages, such as 64, in the least significant subrange analysis block, to determine the complement of the least significant bits.

For the lesser significant bit subrange blocks $14_N$, a circuit such as 54, as shown in FIG. 5, is used. Similar to FIG. 3, a full scale voltage ($V_{REF\ HIGH}-V_{REF\ LOW}$) is divided by a number of equal value resistors, $56_1$ to $56_N$, to produce the reference voltages. For 64 reference voltages, 64 resistors are used. For each reference voltage, a comparator $58_1$ to $58_N$ compares the complementary processed analog residue voltage to the reference to determine the complement value of the subrange's bits. The comparators from comparator $58_N$ and up to the comparator whose reference voltage is the closest and less than or equal to the voltage $V_{2RESO}$ produces a negative comparison signal. In addition, the output of comparator $58_N$ is the complement of the highest true reference voltage and the output of comparator $58_1$ is the complement of the lowest true reference voltage. The decoder 18, as shown in FIG. 1, will take the output of this subrange analysis block and logically invert it to produce the true output for the corresponding subrange bits of the digital output. In general, the outputs of the even numbered subrange analysis blocks will be the complement of the true value, and will require conversion to the true value by the decoder 18.

For example, a high speed ADC using subblocks as per FIGS. 2–5 (5 bit most significant bit subblocks $14_1$ and $13_1$, and a 6 bit least significant bit subblock) can be produced using 0.18 micrometer CMOS technology, using two subrange analysis blocks $14_1$ and $14_2$, and one reference voltage and offset voltage selection block $13_1$, for a 10 bit ADC. Such an ADC can analyze an input signal with frequencies up to 44 MHz, with an input voltage range of 0.5 V to 1.5 V, at a rate of 175 megasamples per second and produce a digital output with a minimum SNDR of 57 dB. The nominal supply voltage is 1.8 Volts.

What is claimed is:

1. An analog to digital converter (ADC) comprising:
   a sampling device for producing a sample of an analog signal;
   a plurality of subrange analysis blocks, each subrange block producing an output representing a subrange of a digital output of the ADC;
   a decoder for receiving the outputs of each subrange block and producing the digital output;
   a reference voltage selection block for producing a reference voltage out of a set of reference voltages representing a magnitude of the analog signal sample; and
   wherein the reference voltage represents a magnitude of the analog signal at a resolution of one of the subrange blocks for use by another of the subrange blocks and a result of the subtraction is offset such that the offset result is in a midrange of a comparitor.

2. The ADC of claim 1 wherein the subrange block plurality is a most significant bits block and a least significant bits block.

3. The ADC of claim 2 wherein the most significant block has a resolution of 5 digital output bits and the least significant block has a resolution of 6 digital output bits and the ADC has a resolution of 10 digital output bits.

4. The ADC of claim 3 wherein one of the bits produced by the subrange blocks is used for error correction.

5. The ADC of claim 1 wherein the sampling device is a sample and hold device for sampling the analog signal and holding samples for use by the subrange analysis block.

6. The ADC of claim 1 further comprising a latch buffer for holding the subrange block outputs prior to receipt by the decoder.

7. The ADC of claim 1 wherein the represented magnitude is greater than or equal to the analog signal sample.

8. The ADC of claim 1 wherein the reference voltage selection block subtracts the analog signal sample from the produced reference voltage for use as an input to another subrange block output.

9. The ADC of claim 1 wherein a result of the subtraction is offset such that the offset result is in a linear range of a comparitor.

10. The ADC of claim 1 wherein a result of the subtraction is doubled.

11. The ADC of claim 1 wherein each subrange block has a plurality of comparitors, each comparitor for comparing a processed version of the sample with one of a respective plurality of reference voltages.

12. The ADC of claim 11 wherein for each subrange block, the reference voltages are produced by a resistor chain.

13. The ADC of claim 11 wherein:
for each comparator in odd ones of the subrange blocks, when the processed version is less than the reference voltage, that comparitor produces a positive signal; and
the decoder receives the positive signal from each comparator producing the positive signals and produces the digital output based on in part the received positive signals.

14. The ADC of claim 11 wherein:
for each comparitor in even ones of the subrange blocks, when the processed version is less than the reference voltage, that comparitor produces a negative signal; and
the decoder receives the negative signal from each comparitor producing the negative signals and produce the digital output based on in part the received negative signals.

15. The ADC of claim 1 having 8 bit resolution produced on an integrated chip using deep submicron technology.

16. The ADC of claim 15 wherein the deep submicron technology is 0.18 micrometer CMOS technology.

17. The ADC of claim 15 wherein the ADC processes samples at at least 170 megahertz.

18. The ADC of claim 17 having a signal to noise distortion ratio of at least 57 decibels.

19. The ADC of claim 5 wherein the ADC requires N−1 clock cycles to process an analog signal sample, where N is a number of the subrange blocks, each subrange block requires one clock cycle to produce its output and the sample and hold device requires one clock cycle to sample.

20. The ADC of claim 19 wherein the sample and hold device holds N (N+1) samples.

21. The ADC of claim 18 wherein the sample and hold device produces a sequential sample on each clock cycle and each subrange block processes sequential samples in respective sequential clock cycles.

22. A reference voltage selection block for use in an analog to digital converter, the reference voltage selection block receives an input signal which enables selection of a reference voltage out of a set of reference voltages, the reference voltage selection block comprising:
a plurality of operational amplifiers, each amplifier configured to produce a unique subset of the reference voltage set and having a same maximum voltage swing of 125 mV; and
a decoder and analog switches for receiving the input signal and selecting one of the operational amplifiers and one reference voltage of that operational amplifier reference voltage subset so that the selected one amplifier produces the selected reference voltage.

23. The reference voltage selection block of claim 22 wherein each unique subset has eight reference voltages.

24. An analog to digital converter (ADC) comprising:
a sampling device for producing a sample of an analog signal;
a plurality of subrange analysis blocks, each subrange block producing an output representing a subrange of a digital output of the ADC and having a plurality of comparitors, each comparitor for comparing a processed version of the sample with one of a respective plurality of reference voltages; and
a decoder for receiving the outputs of each subrange block and producing the digital output; and
wherein:
for each comparitor in odd ones of the subrange blocks, when the processed version is less than the reference voltage, that comparitor produces a positive signal;
for each comparitor in even ones of the subrange blocks, when the processed version is less than the reference voltage, that comparitor produces a negative signal;
the decoder receives the positive signal from each comparitor producing the positive signals and produces the digital output based on in part the received positive signals; and
the decoder receives the negative signal from each comparitor producing the negative signals and produces the digital output based on in part the received negative signals.

* * * * *